(12) United States Patent
McClellan et al.

(10) Patent No.: US 7,569,772 B2
(45) Date of Patent: Aug. 4, 2009

(54) CABLE MANAGEMENT SYSTEM

(75) Inventors: Jeffrey R. McClellan, Raleigh, NC (US); Deborah H. Heller, Raleigh, NC (US); James Xavier Torok, Raleigh, NC (US); Dale Krisher, Wake Forest, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 202 days.

(21) Appl. No.: 11/692,417

(22) Filed: Mar. 28, 2007

(65) Prior Publication Data

US 2008/0237408 A1 Oct. 2, 2008

(51) Int. Cl.
*H01B 7/06* (2006.01)
(52) U.S. Cl. ........................................ 174/69
(58) Field of Classification Search ............... 174/50, 174/52.1, 59, 60, 69; 361/608
See application file for complete search history.

(56) References Cited

U.S. PATENT DOCUMENTS

| | | | |
|---|---|---|---|
| 6,392,149 B1 * | 5/2002 | Kim et al. ............ | 174/72 A |
| 7,026,551 B2 * | 4/2006 | Franz et al. ............ | 174/69 |
| 2008/0240090 A1 * | 10/2008 | Heller et al. ............ | 370/360 |
| 2008/0240409 A1 * | 10/2008 | Heller et al. ............ | 379/291 |
| 2009/0078834 A1 * | 3/2009 | Chen et al. ............ | 248/70 |

* cited by examiner

*Primary Examiner*—Javaid Nasri
(74) *Attorney, Agent, or Firm*—Fogg & Powers LLC

(57) ABSTRACT

An apparatus for managing cables and configured to attach to a side of an electronic device is disclosed. The apparatus has a first planar member which has a plurality of attach points that match a plurality of attach points on an electronic device. The first planar member defines an aperture at least as large as a cable to be attached to the electronic device. The apparatus also has a second planar member parallel to the first planar member. The second planar member has a plurality of attach points that match a plurality of attach points on the electronic device. Additionally, the apparatus has a first support bar connected to and positioned normal to the first planar member and the second planar member.

20 Claims, 4 Drawing Sheets

CABLE MANAGEMENT SYSTEM

RELATED APPLICATIONS

This application is related to the following commonly assigned applications filed on even date herewith, each of which is hereby incorporated herein by reference:

U.S. patent application Ser. No. 11/692,357, entitled "CROSSBAR CABLE" (the '357 application); and U.S. patent application Ser. No. 11/692,449, entitled "PROGRAMMABLE HIGH SPEED CROSSBAR SWITCH" (the '449 application).

BACKGROUND

Many electronic devices have a plurality of cables that are connected to either the front or the rear of the device during operation. For example, desktop computer boxes have a separate cable for USB, Firewire, PS/2, keyboard, parallel ports, Ethernet, power, standard telephone and many others all connected to the back of the computer box simultaneously. Servers, switches, hubs, and routers are other examples of devices with man cables connected. Often, these devices can have on the order of 50 cables connected to the rear of a single box. The weight of the cables that are run up to the device can place a large strain on the cables themselves, the connectors of the cables, the connectors of the device, or the circuit board of the device. After a time this strain damages the cables, connectors, or even the device itself.

For the reasons stated above, and for other reasons stated below which will become apparent to those skilled in the art upon reading and understanding the present specification, there is a need in the art for a mechanism that manages cables connecting to an electronic or optical device.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention. In one embodiment, an apparatus for managing cables and configured to attach to a side of an electronic device is disclosed. The apparatus has a first planar member which has a plurality of attach points that match a plurality of attach points on an electronic device. The first planar member defines an aperture at least as large as a cable to be attached to the electronic device. The apparatus also has a second planar member parallel to the first planar member. The second planar member has a plurality of attach points that match a plurality of attach points on the electronic device. Additionally, the apparatus has a first support bar connected to and positioned normal to the first planar member and the second planar member.

BRIEF DESCRIPTION OF THE DRAWINGS

The present invention can be more easily understood and further advantages and uses thereof more readily apparent, when considered in view of the detailed description and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings that form a part hereof, and in which is shown by way of illustration specific illustrative embodiments in which the device may be practiced. These embodiments are described in sufficient detail to enable those skilled in the art to practice the invention, and it is to be understood that other embodiments may be utilized and that mechanical and structural changes may be made without departing from the spirit and scope of the present invention. The following detailed description is, therefore, not to be taken in a limiting sense.

The present apparatus attaches to an electronic device and manages cables that are connected to the device. This cable management component is primarily composed of two planar members positioned parallel to each other and at least one support bar extending between the two planar members. Each planar member is configured to be connected to the electronic device and extend outward from the rear of the electronic device. The support bar provides added strength to the cable management component and aid in positioning of the cables. Each planar member has a large aperture through which the cables are positioned. The cables are then connected to the rear of the electronic device. The weight of the cables rests on the planar members of the cable management component, instead of directly on the cable-device connection.

Figure 1:
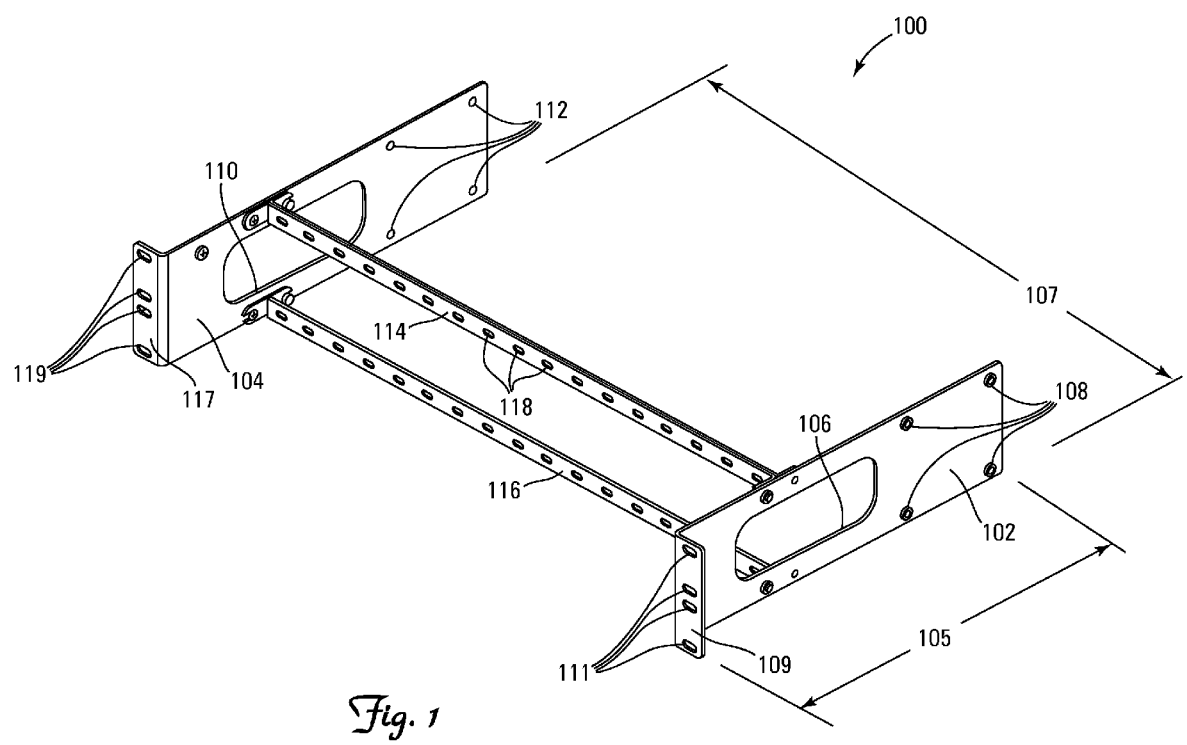
FIG. 1 is a perspective view of one embodiment of a cable management component.

FIG. 1 is a perspective view of one embodiment of a cable management component 100. Cable management component 100 has a first planar member 102 and a second planar member 104. In one embodiment, first planar member 102 and second planar member 104 are the same length 105. Length 105 is sufficient to provide space between an electronic device and a housing for a plurality of cables to be routed through cable management component 100. In another embodiment, length 105 is increased to allow extra space between an electronic device and a housing. A distance 107 between first and second planar members 102, 104 is substantially equal to a width of an electronic device to which cable management component 100 will be attached. In another embodiment, distance 107 is substantially equal to the width of a storage slot within a housing.

First planar member 102 defines a large aperture 106 through which cables are placed. In this embodiment, aperture 106 is vertically centered in first planar member 102, such that there is an approximately equal width of first planar member 102 above and below aperture 106. First planar member 102 also has a plurality of attach points 108 for connecting first planar member 102 to an electronic device. In this embodiment, attach points 108 are slots defined in first planar member 102 for placing a bolt or a screw through first planar member 102 and securing first planar member 102 to an electronic device. First planar member 102 also has a mounting tab 109 which is configured to allow first planar member 102 to be mounted to a housing. In one embodiment, the housing is configured to hold multiple electronic devices. Mounting tab 109 is oriented at a 90 degree angle relative to aperture 106 of first planar member 102 and defines a plurality of small apertures 111 for bolting or screwing mounting tab 109 to the housing.

In this embodiment, second planar member 104 is a substantially identical mirror structure to first planar member 102. Second planar member 104 defines a large aperture 110 through which cables are placed. In this embodiment, aperture 110 is vertically centered in second planar member 104, such that there is an approximately equal width of second planar member 104 above and below aperture 110. Second planar member 104 also has a plurality of attach points 112 for connecting second planar member 104 to an electronic device. In this embodiment, attach points 112 are slots defined in second planar member 104 for placing a bolt or a screw through to secure cable second planar member 104 to a device. Second planar member 104 also has a mounting tab 117 which is configured to allow second planar member 104 to be mounted to a housing. Mounting tab 117 is oriented at a 90 degree angle relative to aperture 110 of second planar member 104 and defines a plurality of small apertures 119 for bolting or screwing to a housing.

Cable management component 100 also has a support bar 114 to aid first planar member 102 and second planar member 104 in supporting the weight of the cables and to aid in positioning of the cables. Support bar 114 is connected to each planar member 102, 104 and runs between each planar member 102, 104. Support bar 114 is positioned normal to a plane formed by each planar member 102. In this embodiment, cable management component 100 has a second support bar 116 that is parallel to first support bar 114. Here, support bars 114, 116 are substantially planar and are oriented to have the longitudinal axis of their cross-sections vertically oriented. Thus, support bars 114, 116 provide maximal support in the vertical direction to combat gravity. In this embodiment, support bars 114, 116 also define a plurality of small apertures 118 along the length of support bars 114, 116. Small apertures 118 allow the cable to be secured in place on cable management component 100. This is explained in detail with respect to FIG. 3.

Additionally, cross-sections of first support bar 114 and second support bar 116 are small enough such that support bars 114, 116 fit on planar members 102, 104 above and below respectively apertures 106, 110. Positioning support bars 114, 116 immediately above and below apertures 106, 110 places support base 114, 116 where the majority of the weight from the cables is distributed. Also, using two support bars 114, 116 allows the cables to be routed between the support bars 114, 116 and optionally rest on bottom support bar 116. In another embodiment, support bars 114, 116 are connected to planar members 102, 104 near the end farthest from where planar members 102, 104 connect to an electronic device. In yet another embodiment, a single larger support bar is used and the support bar is the same height as planar members 102, 104. In still another embodiment, support bars 114, 116 are cylindrical.

In this embodiment, apertures 106, 110 of first planar member 102 and second planar member 104 are rectangular in shape with rounded corners. The rectangular shape provides a large amount of space to place the cables through. Additionally, having a closed aperture 106, 110 (i.e. having planar member on all four sides) provides strength to planar members 102, 104. In another embodiment, apertures 106, 110 are round in shape. In yet another embodiment, planar members 102, 104 do not form a closed aperture. In this embodiment, a 'u' shape is formed and the cables are placed and held in the 'u' shape by gravity. In the embodiment shown in FIG. 1, apertures 106, 110 are substantially vertically centered in each planar member 102, 104 to provide equal strength to planar members 102, 104 on top and bottom.

In the embodiment shown in FIG. 1, cable management component 100 is composed of metal, more specifically sheet metal. In another embodiment, cable management component 100 is composed of plastic. In yet another embodiment, planar members 102, 104 are composed of sheet metal and support bars 114, 116 are composed of plastic.

Figure 2:
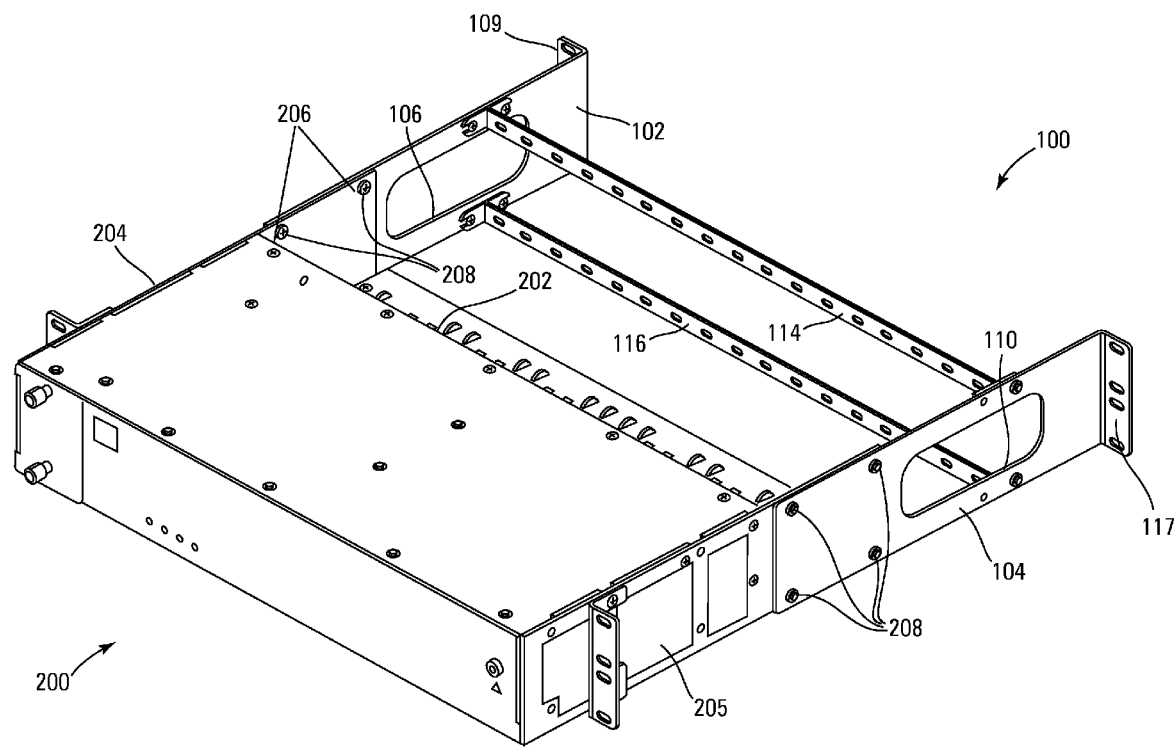
FIG. 2 is a perspective view one embodiment of a system having the cable management component of FIG. 1 connected to an electronic device.

FIG. 2 is a perspective view of one embodiment of cable management component 100 connected to an electronic or optical device 200. Electronic device 200 is a six sided box including a rear side 202 upon which connectors (shown in FIG. 3) are located. Cable management component 100 is attached to electronic device 200 on both sides 204, 205 of electronic device 200. Attach points 108, 112 match up with similar attach points (e.g. 206) on electronic device 200. In this embodiment, bolts 208 are placed through attach points 108, 112 on planar members 102, 104 and through attach points (e.g. 206) on electronic device 200.

Cable management component 100 extends outward from rear 202 of electronic device 200. Each planar member 102, 104 attaches to electronic device 200 on one side 204, 205 of electronic device 200 respectively. Each planar member 102, 104 extends outward normal to a plane created by rear 202 and parallel to sides 204, 205 of electronic device 200. This allows cables, which connect to rear 202, to be easily routed through apertures 106, 110. In another embodiment, planar members 102, 104 have a 90 degree bend such that they attach to rear 202 of electronic device parallel to rear 202 and curve such that apertures 106, 110 are positioned normal to rear 202. Additionally, in one embodiment, once cable management component 100 is attached to electronic device 200, electronic device 200 is mounted to a housing via tabs 109, 117 of cable management component 200.

Figure 3:
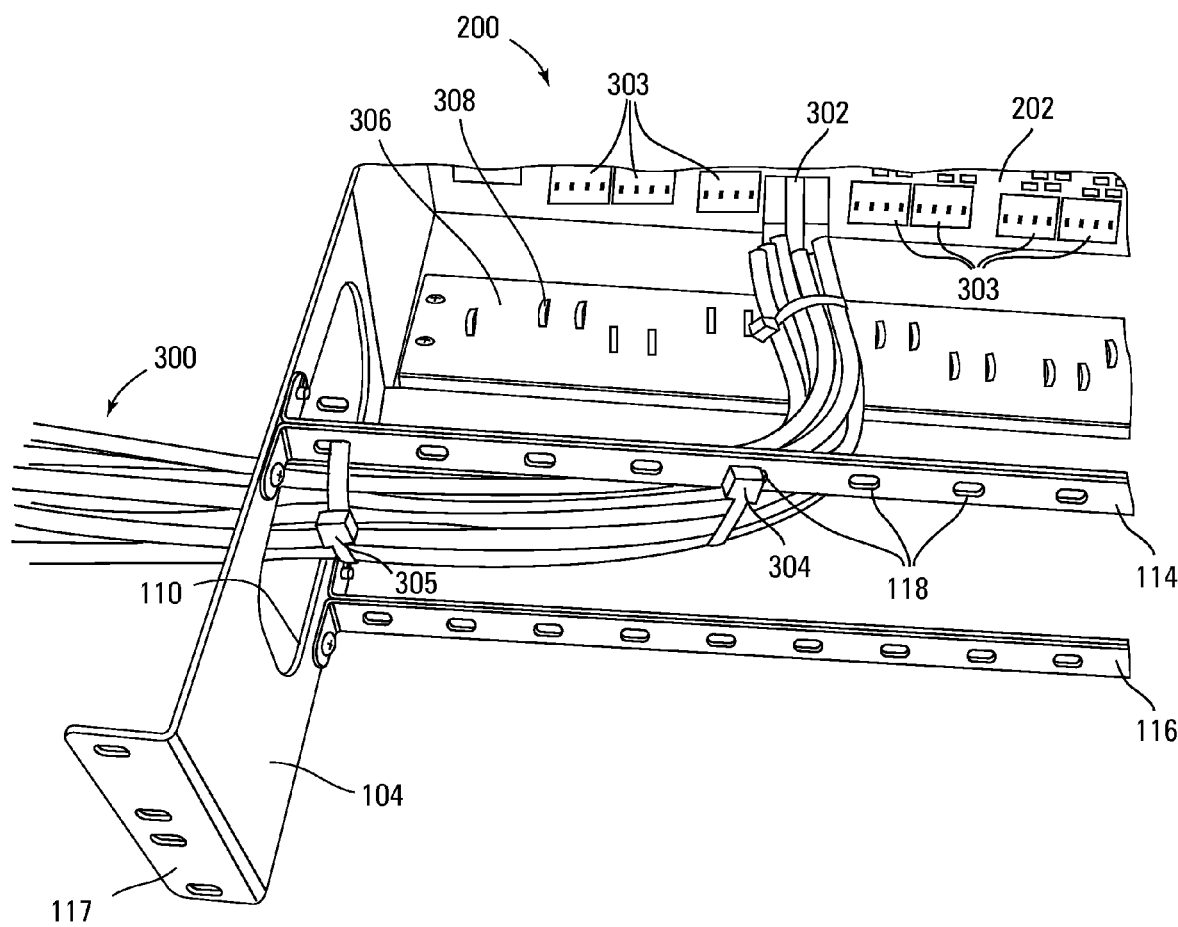
FIG. 3 is a perspective view of one embodiment of the system of FIG. 2 with a cable connected to the electronic device.

FIG. 3 is a perspective view of one embodiment of cable management component 100 with a cable 300. Cable 300 is an information carrying cable which electronic device 200 uses to transmit or receive communications. In this embodiment, cable 300 is a bundle composed of multiple Ethernet lines. Cable 300 is routed through aperture 110 of cable management component 100 and cable 300 is routed at approximately a 90 degree angle and connected to a connector 302 on rear 202 of electronic device 200.

In order to allow cable 300 to be routed through aperture 110, aperture 110 is at least as large as cable 300. In this embodiment, aperture 110 is large enough so that multiple cables 300 fit through aperture 110. For example, electronic device 200 has twelve (12) connectors for cables 300. Thus, when electronic device 200 is fully connected with twelve cables 300, half of cables 300 connected to electronic device 200 are routed through planar member 102 and the other half of cables 300 are routed through planar member 104. Thus, in this embodiment aperture 110 is large enough to route sic (6) cables 300 therethrough.

Cable 300 is also routed between support members 114, 116 and attached to support member 114. Thus, cable management component 100 supports the weight of cable 300 and less strain is placed on connector 302. In this embodiment, cable 300 is held in place by securing to support bar 114 with a tie wrap 304. Apertures 118 defined in support bar 114 are large enough to fit tie wrap 304 through. Thus, to secure cable 300 in place, tie wrap 304 is wrapped around cable and one end of tie wrap 304 is routed through an aperture 118 in support bar 114. Tie wrap 304 is then closed by inserting the male end of the tie wrap into the female end and tightening.

This holds cable 300 in position and minimizes the amount of force from forces applied to the cable to be placed on connectors 302. As shown in FIG. 3, cable 300 is secured to support bar 114 in a second location with a second tie wrap 305. In another embodiment, a second cable is routed through aperture 106 and connected to a connector 202 on rear of electronic device 200. The second cable is then secured to bottom support bar 116 with an additional tie wrap. In yet another embodiment, wire is routed through apertures 118 and used to secure cable 300. In this embodiment, apertures 118 are only large enough to fit the wire therethrough. Alternatively, anything known to those skilled in the art could be used to secure cable 300 to support bars 114, 116. In this embodiment, cable management component 100 is attached to electronic device 200 at the time of initial installation of electronic device 100. In another embodiment, cable management component 100 is configured to be retrofit to electronic device 200 after initial installation of electronic device 200.

Also shown in FIG. 3 is a cable securing platform 306. In this embodiment cable securing platform 306 is a separate piece from cable management component 100. Cable securing platform 306 is, therefore, individually attached to electronic device 200 separately from cable management component 100. In another embodiment, cable securing platform 306 is integral with cable management component 100. In the embodiment shown in FIG. 3, cable securing platform 306 is a planar structure with a plurality of loops 308. The planar surface of cable securing platform 306 is oriented parallel to the direction of cable 300 as cable 300 connects to electronic device 200. The planar surface of cable securing platform 306 is also oriented perpendicular to back side 202 of device 200. As explained above, back side 202 of device 200 has a plurality of connectors 303 each for receiving a cable 300. Cable securing platform 306 is positioned at approximately the bottom of connectors 303. Cable 300 rests on cable securing platform 306 when they connect to electronic device 200. Thus, cable securing platform 306 is positioned below cable 300 to counteract the force of gravity upon cable 300.

Loops 308 are configured to allow a tie wrap or similar securing mechanism to wrap therethrough and secure cable to cable securing platform 306. In this embodiment, there are two loops 308 per cable 300. In another embodiment, only one loop 308 is used per cable 300. In yet another embodiment, an aperture in cable securing component 306 is used to route a tie wrap through and secure cable 300. Cable securing platform 306 aids in preventing stress transfer from cable 300 to connectors 303. Part of the stress reduction results from the proximity of the securing point (i.e. loops 308) of cable 300 to connectors 303. The short distance between the securing point and the cable connection to electronic device 200 aids in reducing stress to cable 300 and electronic device 200.

Figure 4:
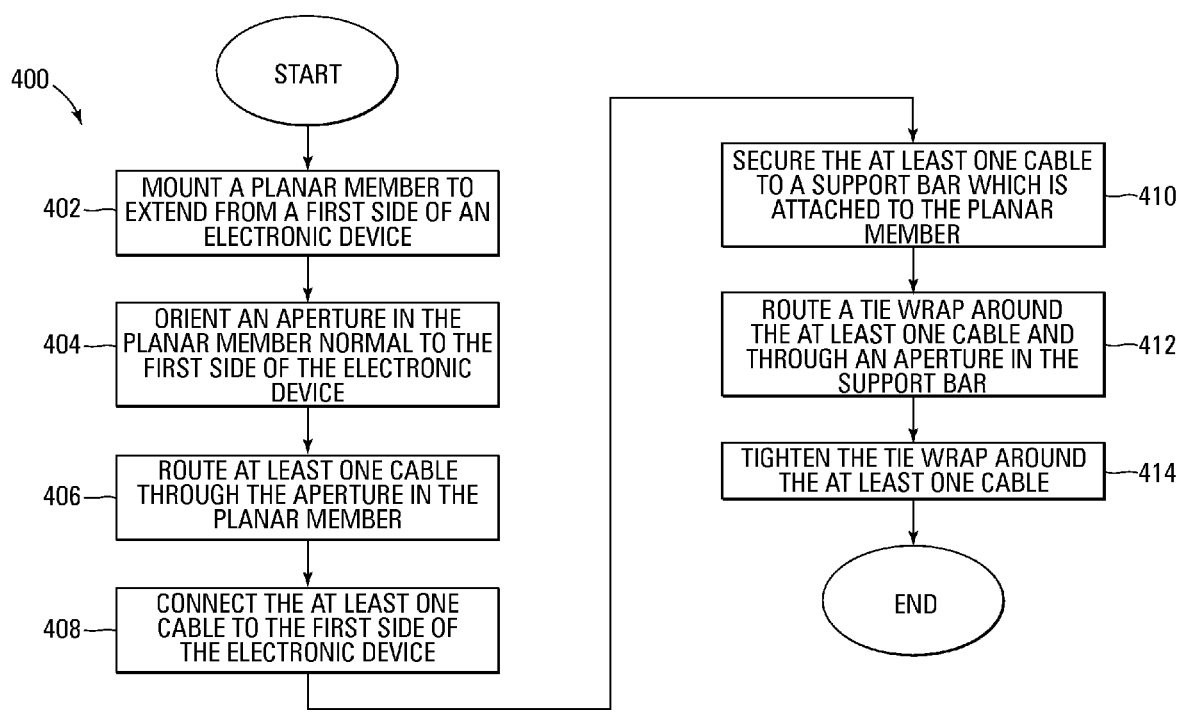
FIG. 4 is a flow chart illustrating one embodiment of a method of managing a cable using the cable management component of FIG. 1.

FIG. 4 is a flow diagram illustration one embodiment of a method 400 of managing a cable 300 using cable management component 100. Method 400 begins by mounting first planar member 102 to electronic device 200 such that first planar member 102 extends from rear 202 of the electronic device 200 (402). First planar member 102 is also oriented so that aperture 106 in first planar member 102 is normal to rear 202 of electronic device 200 (404). To connect cable 300, it is routed through aperture 106 in first planar member 102 (406) and connected to rear 202 of electronic device 200 (408). Cable 300 is also secured to support bar 114 (410). To secure cable 300, tie wrap 304 is routed around cable 300 and through aperture 106 in support bar 114 (412). Tie wrap 304 is then tightened around cable 300 (414).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system for managing cables and configured to attach to a side of an electronic device comprising:
    a first planar member having a plurality of attach points that match a plurality of attach points on an electronic device, the first planar member defining an aperture at least as large as a cable to be attached to the electronic device;
    a second planar member parallel to the first planar member and having a plurality of attach points that match a plurality of attach points on the electronic device;
    a first support bar connected to and positioned normal to the first planar member and the second planar member; and
    a second support bar parallel to the first support bar, wherein the first support bar is connected to the first planar member above the aperture of the first planar member and the second support bar is connected to the first planar member below the aperture of the first planar member.

2. The system of claim 1, wherein each of the plurality of attach points of the first planar member is a slot defined in first planar member; and
    where each of the plurality of attach points of the second planar member is a slot defined in the second planar member.

3. The system of claim 1, wherein the aperture of the first planar member has a rectangular shape with rounded corners.

4. The system of claim 1, wherein the aperture of the first planar member has a substantially 'u' shape.

5. The system of claim 1, wherein the aperture of the first planar member has a generally round shape.

6. The system of claim 1, wherein the aperture of the first planar member is substantially vertically centered in the first planar member.

7. The system of claim 1, wherein the aperture of the first planar member is large enough to route multiple cables through.

8. The system of claim 1, wherein the second planar member defines an aperture at least as large as a cable to be attached to the electronic device.

9. The system of claim 8, wherein the aperture of the second planar member is substantially similar to the aperture of the first planar member.

10. The system of claim 1, wherein the first support bar has a plurality of apertures for tie wraps.

11. The system of claim 1, wherein the first planar member and the second planar member are composed of a material selected from the group consisting of sheet metal and plastic.

12. The system of claim 1, wherein the first support bar and the second support bar are composed of a material selected from the group consisting of metal and plastic.

13. The system of claim 1, further comprising:
    a cable securing platform having a planar surface oriented perpendicular to a side of the electronic device, the side of the electronic device having at least one connector for a cable, the cable securing platform having a plurality of loops for securing a cable that connects to the at least one connector.

14. The system of claim 13, wherein the first planar member, the second planar member, the first support bar, the second support bar, and the cable securing platform are an integral unit.

15. The system of claim 1, wherein the first planar member, the second planar member, the first support bar, and the second support bar are an integral unit.

16. A system for managing cables comprising:
   an electronic device having a first side with at least one connector for an information carrying cable, a second side forming a corner with the first side, and a third side forming another corner with the first side;
   a first planar member attached to the second side of the electronic device, the first planar member defining an aperture at least as large as a cable to be attached to the first side of the electronic device;
   a second planar member attached to the third side of the electronic device and parallel with the first planar member, the second planar member defining an aperture at least as large as a cable to be attached to the first side of the electronic device;
   a first support bar attached between the first planar member and the second planar member and oriented orthogonal to the first planar member and the second planar member; and
   a second support bar parallel to the first support bar, wherein the first support bar is connected to the first planar member above the aperture of the first planar member and the second support bar is connected to the first planar member below the aperture of the first planar member.

17. The system of claim 16, wherein the aperture of the first planar member and the aperture of the second planar member are oriented normal to the first side of the electronic device.

18. The system of claim 16, wherein the aperture of the first planar member is large enough to route multiple cables through.

19. The system of claim 16, wherein the first planar member further comprises a plurality of attach points to attach the first planar member to the second side, wherein each of the plurality of attach points of the first planar member is a slot defined in first planar member; and
   wherein the second planar member further comprises a plurality of attach points to attach the second planar member to the third side, wherein each of the plurality of attach points of the second planar member is a slot defined in the second planar member.

20. The system of claim 16, wherein the first support bar has a plurality of apertures for tie wraps.

* * * * *